United States Patent [19]

Hallauer

[11] Patent Number: 4,520,464

[45] Date of Patent: May 28, 1985

[54] TRANSPARENT INSTRUCTION WORD BUS MEMORY SYSTEM

[75] Inventor: John J. Hallauer, Colorado Springs, Colo.

[73] Assignee: NCR Corporation, Dayton, Ohio

[21] Appl. No.: 383,869

[22] Filed: Jun. 1, 1982

[51] Int. Cl.³ ............................................. G11C 13/00
[52] U.S. Cl. ..................................... 365/189; 365/203
[58] Field of Search ............... 365/182, 189, 203, 230; 364/400, 518

[56] References Cited

U.S. PATENT DOCUMENTS 3,737,879  6/1973  Greene et al. ....................... 365/222

Primary Examiner—Terrell W. Fears

Attorney, Agent, or Firm—J. T. Cavender; Casimer K. Salys

[57] ABSTRACT

A memory architecture for a single chip microprocessor or microcomputer in which instruction words have a greater bit length than the data words and the need exists for additional off-chip program memory. The instruction word lines from the off-chip program memory are coupled directly into the existing columns of a matrix on-chip, program memory ROM. Supplemental FETs are connected to selected rows and columns of the on-chip ROM and are operated in such a way that it is possible to either enable the on-chip ROM and decouple the off-chip instruction words, or to disable the on-chip ROM and couple the off-chip instruction words through the on-chip ROM.

9 Claims, 5 Drawing Figures

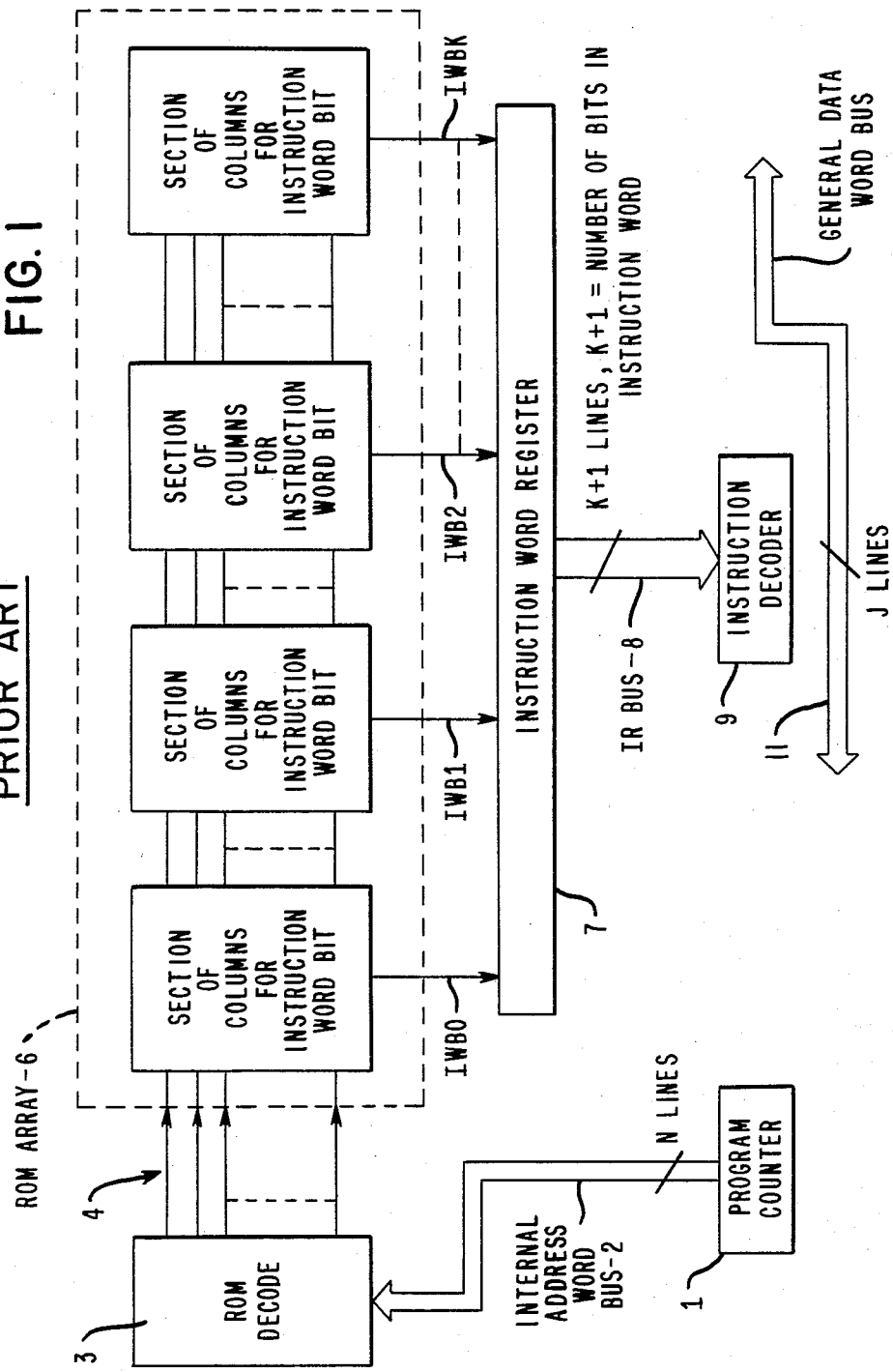

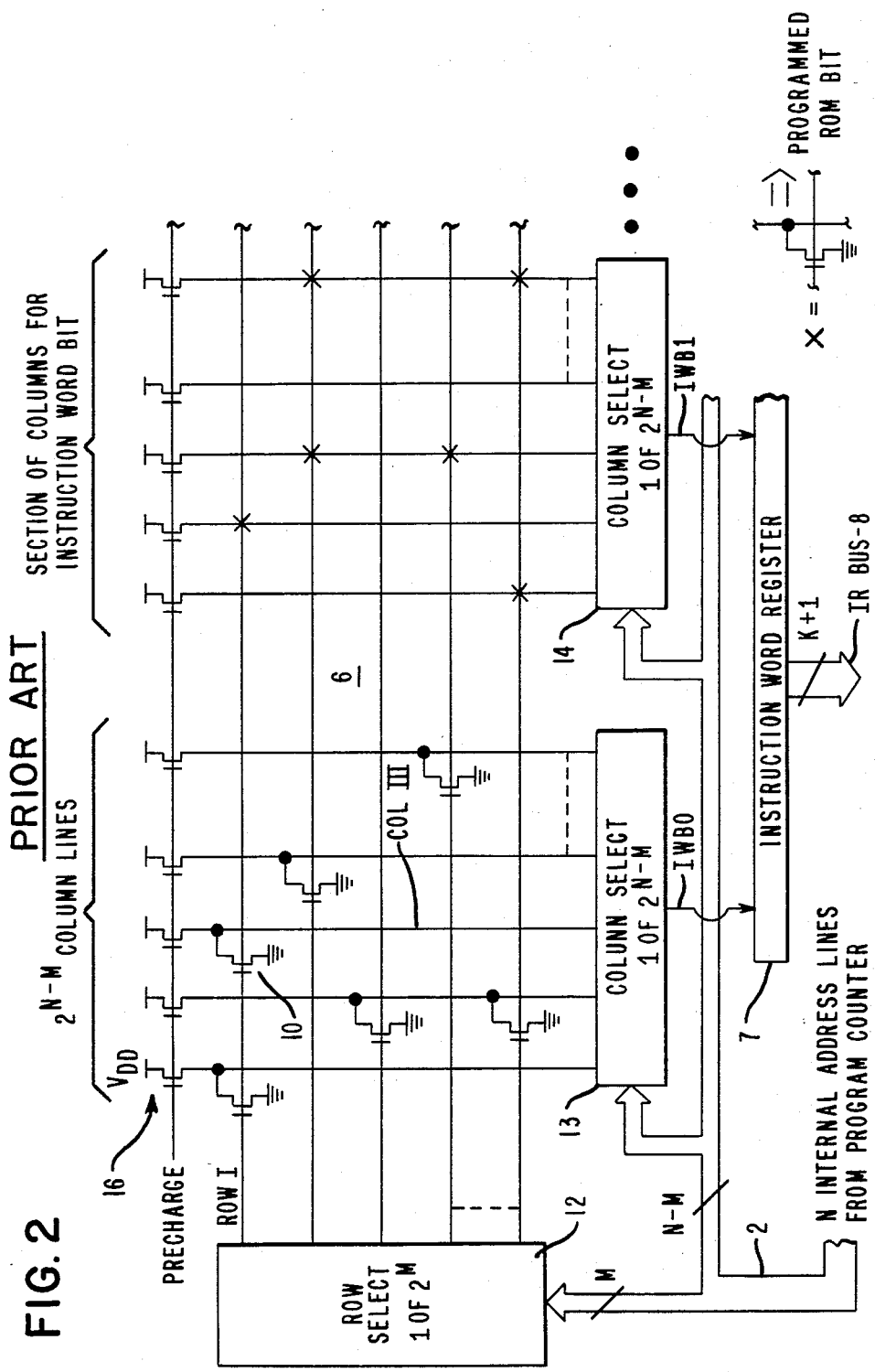

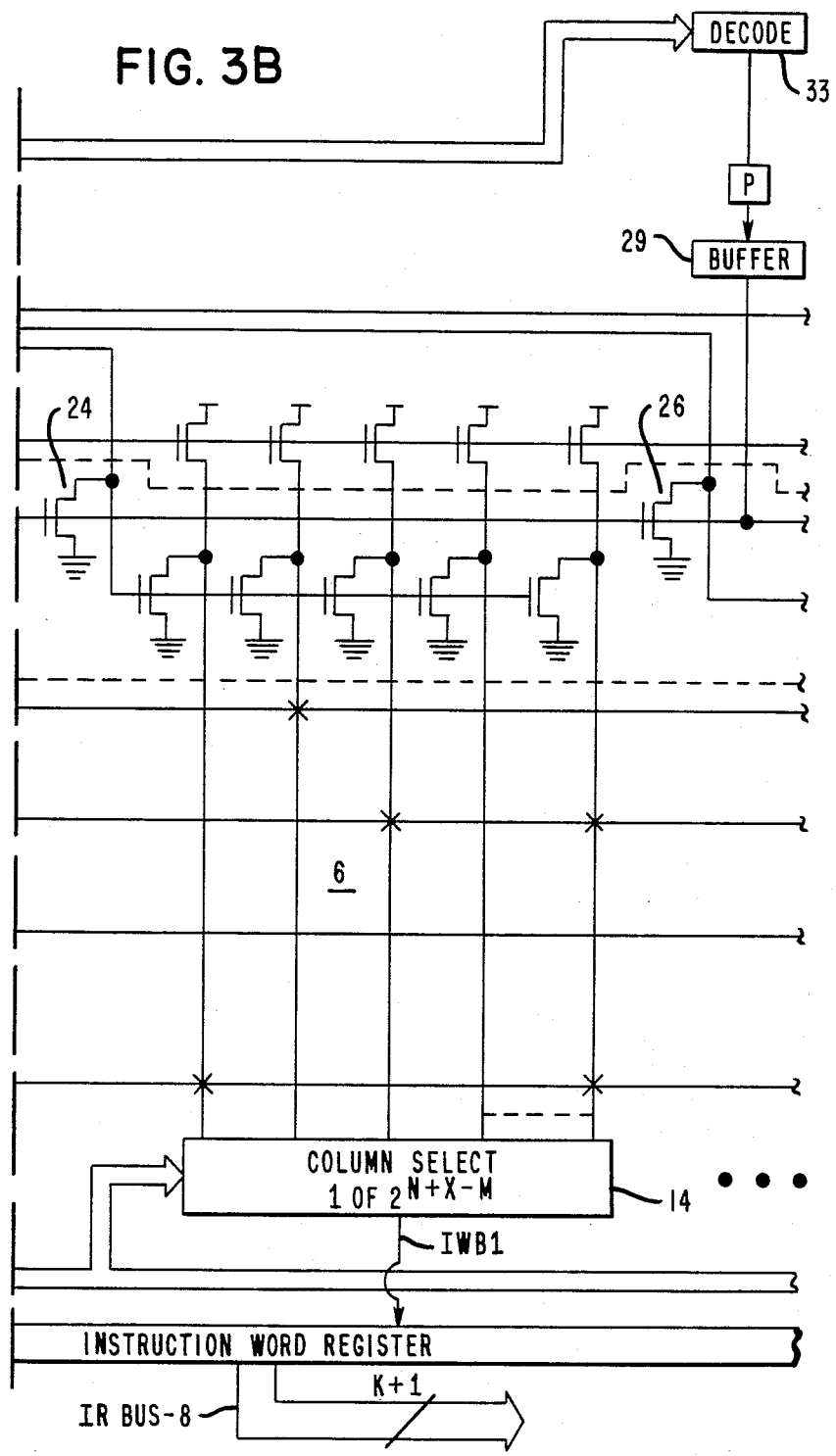

TRANSPARENT INSTRUCTION WORD BUS MEMORY SYSTEM

BRIEF SUMMARY

The present invention relates to memory architectures for use in single chip microprocessors or microcomputers. More specifically, the invention teaches an efficient architecture for a microprocessor or a microcomputer using Instruction Words which both have a greater bit length than the data words and require addressable off-chip Program Memory. The presently disclosed Transparent Instruction Word Bus (TRANSBUS) architecture couples Instruction Word signals from addressable Off-Chip Program Memory directly through a dedicated section of addressable On-chip Memory and into the Instruction Word Register. Thereby, Off-Chip Program Memory signals are perceived within the microprocessor or microcomputer as virtual On-Chip Program Memory signals.

In an exemplary embodiment, one programmable bit position, e.g. a supplemental field effect transistor (FET), is added to each column of the On-Chip Read Only Memory (ROM) used to generate Instruction Word Bits. In addition, the On-Chip ROM is altered to include a number of disabling FETs, one for each row and another for each grouping of the supplemental column FETs noted earlier. When Off-Chip Instruction Word Bits are selected by address signals on the Address Word Bus, the conventional section of the On-Chip ROM is disabled. Coincident with the disabling, the Off-Chip Instruction Word signals are coupled, through the supplemental column FETs, directly into the Instruction Register along preexisting lines and through preexisting Column Select blocks.

These and other beneficial features of the present invention will become more clearly understood upon considering the descriptions of the ensuing embodiments.

DESCRIPTION OF THE DRAWINGS

FIG. 1 is a generalized schematic block diagram of On-Chip ROM circuit in a Nonmultiplexed Address, Separate Bus (NASBUS) architecture microprocessor or microcomputer.

FIG. 2 is a section of the On-Chip ROM circuit in FIG. 1, shown schematically in greater detail.

FIGS. 3A and 3B schematically depict an On-Chip ROM circuit configured according to one embodiment of the Transparent Instruction Word Bus (TRANSBUS) architecture.

DETAILED DESCRIPTION

Figure 3A:
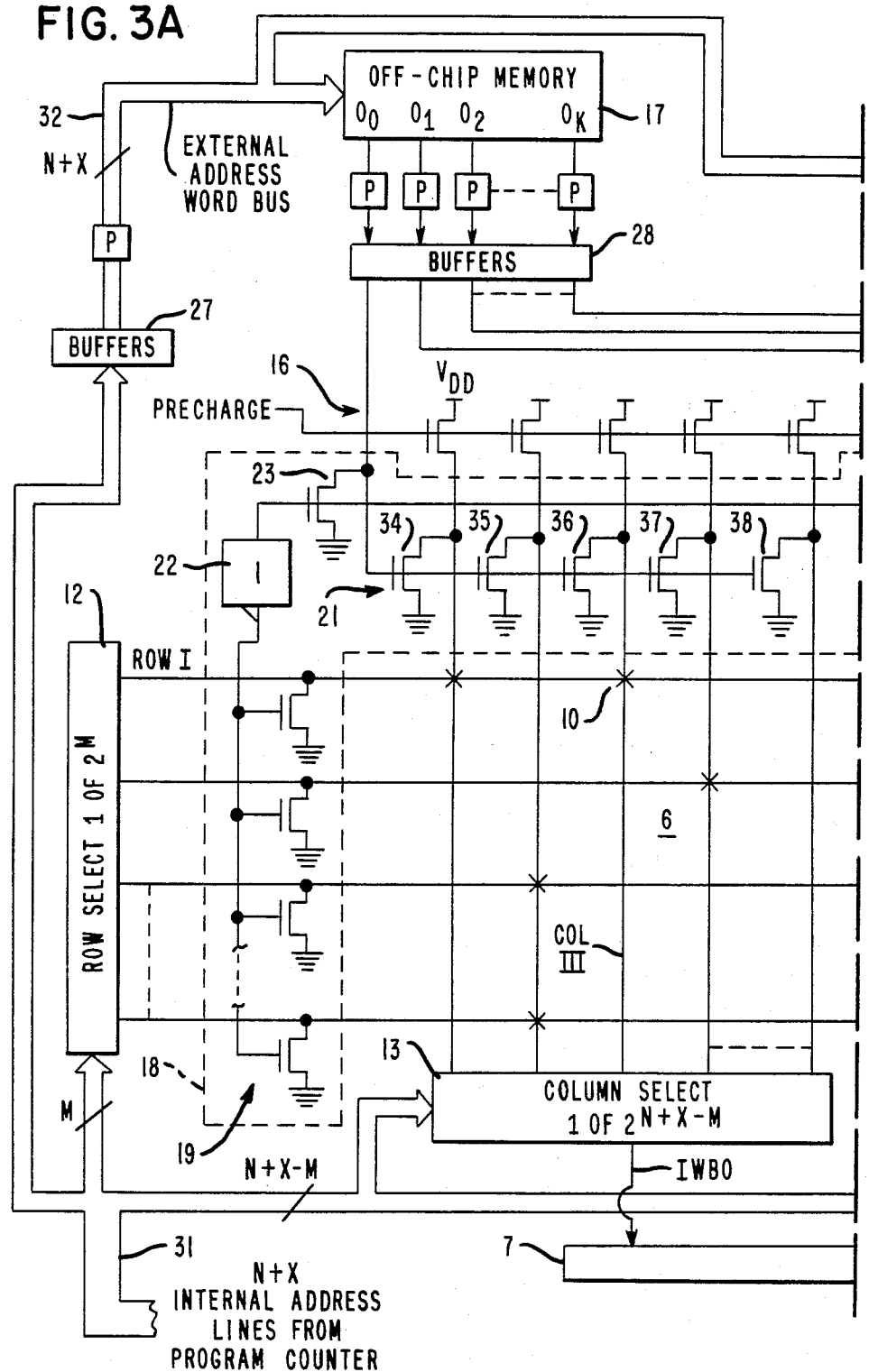

Single chip microprocessors and microcomputers generally use Instruction Words and Data Words of the same length, a design arrangement commonly referred to as the Multiplexed Address, Shared Bus architecture. This design approach simplifies internal communication by allowing the multiplexed sharing of the single Internal Bus for both Instruction and Data Words. With this arrangement, external signals are readily coupled into the Internal Bus by buffered multiplexing to Off-Chip Buses of the same size. Consequently, Instruction and Data Word signals travel on the same bus both on and off the chip.

The trend for designs of microprocessors and microcomputers is oriented toward the use of Instruction Words having bit lengths numerically greater than the Data Words; a structural arrangement generally known as a Nonmultiplexed Address, Separate Bus (NASBUS) architecture. The advantage of longer Instruction Words appears in terms of code efficiency and speed, while the disadvantage lies with the need for two separate Internal Bus lines, the Instruction Word Bus and the Data Word Bus. The detracting aspects of the NASBUS architecture are even greater when it becomes necessary to couple signals from Off-Chip Program Memory, in that each line of the Instruction Word Bus, the Data Word Bus, and the Address Word Bus directed to the Off-Chip Program Memory potentially requires buffering and bonding off the chip.

Another consideration arising when Off-Chip Program Memory is proposed for a single chip microprocessor or microcomputer having a NASBUS architecture relates to the efficient utilization of chip area. On-Chip ROMs are normally rectangular in shape with the Row Selectors and their corresponding Row Address lines projecting along one edge, and the Column Selectors and their corresponding Column Address lines projecting along another edge. The Instruction Word Register coupled to the Column Selectors normally lies immediately adjacent them. It is also relatively conventional to locate On-Chip ROMs at or very near the periphery of the microprocessor or microcomputer chip. Singly or together, these conventions make it difficult and area-inefficient to route the relatively wide Instruction Word Bus and Address Word Bus to locations where supplemental registers and bonding pads can more readily be located. As a specific example, consider a NASBUS architecture microprocessor or microcomputer in which the Instruction and Address Word Buses are each twelve lines wide; potentially requiring a routing of 24 distinct lines, the addition of 24 buffers, the addition of a supplemental 12 bit Instruction Word Register, and the distribution of the lines to 24 additional, edge-located bonding pads.

The Transparent Instruction Word Bus (TRANSBUS) architecture of the present invention provides a NASBUS architecture, single chip microprocessor or microcomputer with access to Off-Chip Program Memory through existing On-Chip circuitry, with a minimum number of buffers and bonding pads along the nonmemory periphery of the chip. In addition, when using the TRANSBUS architecture, extended runs of the Instruction Word Bus and Address Word Bus are eliminated, as are the supplemental Instruction Word Registers otherwise required with the standard NASBUS architecture.

Attention is now directed to FIG. 1 of the drawings, where there appears a generalized schematic block diagram of the on-chip areas adjacent a Program Memory ROM in a NASBUS architecture, single chip microprocessor or microcomputer of conventional design. Program Counter 1 generates a binary count sequence which serves as an Address Code, N bits in length, on Internal Address Word Bus 2. ROM Decoder 3 converts the N bit Address Code into row and column select signals on lines 4 to extract Instruction Word signals, IWB0–IWBK from the K+1 individual sections of ROM Array 6. The Instruction Word for each count is entered into Instruction Word Register 7 for temporary retention and synchronization. At the appropriate time, the Instruction Word stored in Instruction Word Register 7 is coupled to Instruction Register (IR) Bus 8. Note the correspondence between the K+1 number of Instruction Word Bits IWB and the size of IR Bus 8. Each Instruction Word is subsequently decoded in conventional manner using Instruction Decoder 9 to control the operation of the microprocessor or microcomputer.

A General Data Word Bus, 11, having J lines is depicted in a portion of FIG. 1 to establish the distinction that normally exists in a NASBUS architecture microprocessor or microcomputer between the Internal Address Word Bus at 2, the IR Bus at 8, and the General Data Word Bus at 11. By definition, the NASBUS architecture K+1 is numerically greater than J. Therefore, the normally diverse routing of General Data Word Bus 11 is not suitable for Instruction Word signals either on or off the chip. General Data Word Bus 11 has been omitted from FIGS. 2-4 in that it remains an independent and substantially unrelated communication path on the single chip microprocessor or microcomputer.

The ROM section of the NASBUS architecture microprocessor or microcomputer is again shown in FIG. 2, presented here in somewhat greater structural detail to illustrate the conventional organization of an On-Chip Program Memory. As shown, the N Internal Address lines 2 are divided into sections, with M lines being coupled to Row Select block 12 and the remaining N-M lines coupled to each Column Select block, such as 13 and 14, numbering K+1 in total count. Each Instruction Word Bit, IWB0, IWB1, etc. depends on the combination of the Address Code and the ROM content, where the latter is here represented generally by the presence of an n-channel, enhancement mode FET, or their equivalent symbol "X", in ROM array 6. Since the Program Memory structure depicted in FIG. 2 is relatively well known, it needs no elaborate development, excepting to note that a precharge FET from the group at 16 is coupled to voltage source $V_{DD}$ and each column of ROM Array 6.

Now consider one embodiment of the present invention, as it appears in the composite schematic encompassing FIGS. 3A and 3B of the drawings. A comparison with FIG. 2 provides some indication of both the similar and the distinct features. From such an overview, one no doubt recognizes that the TRANSBUS architecture of the present invention provides an efficient means by which signals from Off-Chip Memory 17 can be coupled to a NASBUS architecture microprocessor or microcomputer without unduly complicating the conventional bus arrangement and bonding pad configuration. In a generalized sense, Program Memory Instruction Word signals from Off-Chip Memory 17 are projected directly through the structure of the On-Chip Memory, ROM Array 6, and into Instruction Word Register 7. A detailed analysis follows.

Note that the TRANSBUS architecture in FIG. 3 retains the original structure of Instruction Word Register 7, Row Select block 12, and the multiple sections of Column Select blocks beginning with the two designated by reference numerals 13 and 14. The matrix ROM Array, 6, and the group of precharge FETs 16 also remain unaltered from the conventional NASBUS architecture in FIG. 2.

The operation of ROM Array 6, when On-Chip memory is selected, also conforms to that experienced with the conventional NASBUS configuration. Namely, precharge FETs 16 are pulsed immediately prior to addressing the ROM Array so as to charge the distributed capacitance on each column line to a potential $V_{DD}$. The presence or absence of a memory FET at a ROM address, such as the FET at 10 (FIG. 2) in Row I and Column III, is detected by applying a signal on Row I and then sensing Column III to determine whether the precharged potential remains. It is readily apparent that the presence of a FET at 10 causes the address signal on Row I to discharge Column III, which appears on line IWB0 as a "0" if Column III is addressed by Column Select block 13.

The dominant structural features which distinguish a TRANSBUS architecture single chip microprocessor or microcomputer from one having a conventional NASBUS architecture are enclosed within dashed perimeter line 18. As shown in FIGS. 3A and 3B, the implementation of the TRANSBUS architecture involves an expansion of ROM Array 6 by one column of FETs, 19, one row of FETs, 21, and a group of inverting FETs exemplified by 22, 23, 24 and 26. The cooperative operation of these devices in the context of the TRANSBUS architecture will be described hereinafter.

FIGS. 3A and 3B also show the addition of Buffers 27, 28 and 29 to the conventional NASBUS single chip microprocessor or microcomputer. One no doubt recognizes that these devices are added to the chip as an interface precaution, and consequently do not directly affect the fundamental structures and functions introduced by the elements within perimeter line 18. The graphic representation of the letter "P" within a small square represents one or more bonding pads by which On-Chip signal lines are coupled off the chip.

FIG. 3A shows that the bit length of the Internal Address Word, and correspondingly Internal Address Word Bus 31, has been increased from the former count of N by the addition of X bits. Though the X additional bits would usually be required to extend the address sufficiently to cover the combination of the On-Chip Program Memory, the Off-Chip Program Memory, and the coded selection therebetween, the expansion may not be required if the former bit length, N, sufficiently exceeds the content of ROM Array 6.

External Address Word Bus 32 is shown to be coupled to Decode block 33 in FIG. 3B. Decode block 33 senses the address signals to determine whether On-Chip or Off-Chip Program Memory has been selected.

Off-Chip Memory 17 or the On-Chip Program Memory in ROM Array 6 are selected alternatively. For purposes of the present embodiment, the internal arrangement of Off-Chip Memory 17 is defined as being similar in architecture to the ROM in FIG. 2. It is no doubt clearly recognized that Off-Chip Memory 17 is not limited to that configuration, or even a ROM structure, but fully encompasses any addressable source of binary signals accessable on K+1 parallel output lines.

To understand the operation of the embodied TRANSBUS architecture, consider the two individual modes of operation to which the architecture is suited. The first mode corresponds to an address prescribing a row and a column in the On-Chip Program Memory. The second mode represents the TRANSBUS response when the address is directed to a row and a column in the Off-Chip Program Memory. In both cases, the objective is to enter a binary Address Word on Internal Address Word Bus 31 and receive a corresponding group of K+1 Instruction Word Bits on parallel bits lines IWB0, IWB1, etc. for entry into Instruction Word Register 7 and subsequent transmission onto IR Bus 8.

The first mode of operation is initiated when the address generated by the Program Counter 1 (FIG. 1) enables Decoder 33. Decoder 33 then generates a signal which is coupled through Buffer 29 to turn FETs 23, 24, 26, etc. to their "on" or conducting state. With these FETs conducting, any nonzero signals originating in Off-Chip Memory 17, e.g., on lines $O_0$, $O_1$ and $O_2$, are clamped to ground potential. Consequently, all the FETs in row 21 remain "off" or nonconducting. Inverter 22 produces the same zero potential clamping on the gate electrodes of the FETs in column 19. It is readily apparent that these concurrent actions decouple any nonzero Instruction Word Bit signals from Off-Chip Memory 17, while enabling the operation of ROM Array 6 in conventional manner.

The second mode of operation entails the effective disabling of the Program Memory in ROM Array 6 and substituting in its place the Program Memory generated by addressing Off-Chip Memory 17. This is accomplished by the absence of a signal from Decode block 33. In this case, FETs 23, 24, 26, etc. are nonconducting, while Inverter 22 places the FETs in column 19 into a fully conducting state. It is no doubt clear that all the Row Select lines, such as Row I, and consequently ROM Array 6, are now disabled by the action of the FETs in column 19.

To understand how Off-Chip Program Memory words are transferred directly through ROM Array 6, note that the FETs in row 21 are grouped in correspondence to sections of the columns in ROM Array 6. For instance, FETs 34–38 coincide with the section of the ROM Array utilizing Column Select block 13. It should also be recognized that each Instruction Word line, $O_0$–$O_K$, from Off-Chip Memory 17 is simultaneously commonly coupled to the FETs in row 21 by sections.

Given this structural arrangement for the TRANS-BUS architecture, during the second mode of operation each line of the Off-Chip Instruction Word is projected into a whole section of ROM Array 6 and appears at the output of the respective Column Select block, e.g. IWB0 for Column Select 13, irrespective of the actual address entered into a Column Select block. Thereby, the signals on Off-Chip Instruction Word lines $O_0$–$O_K$ are transposed to On-Chip Instruction Word Bus lines IWB0–IWBK, and eventually to Instruction Word Register 7 and the IR Bus 8.

Consider the following specific example for illustrating an operation in the second mode. Program Counter 1 (FIG. 1) generates an on-chip address which selects Row I and Column III of ROM Array 6 in FIG. 3A and creates a binary "1", or high signal level, on line $O_0$ from Off-Chip Memory 17. In that situation, FETs 34–38 are all energized and discharge any precharge potential on the 5 column lines connected to Column Select block 13. The selection of Row I is therefore of no consequence, in that all the FETs in Column 19 have clamped all the rows from Row Select block 12 to ground potential. At the same time, the selection of Column III conveys the binary "1" signal from line $O_0$ to line IWB0. Each of the succeeding sections of grouped columns in ROM Array 6 operates in analogous fashion. In this way, the binary states on Instruction Word lines $O_0$–$O_K$ from Off-Chip Memory 17 appear as Instruction Word Bits IWB0–IWBK.

Figure 4:
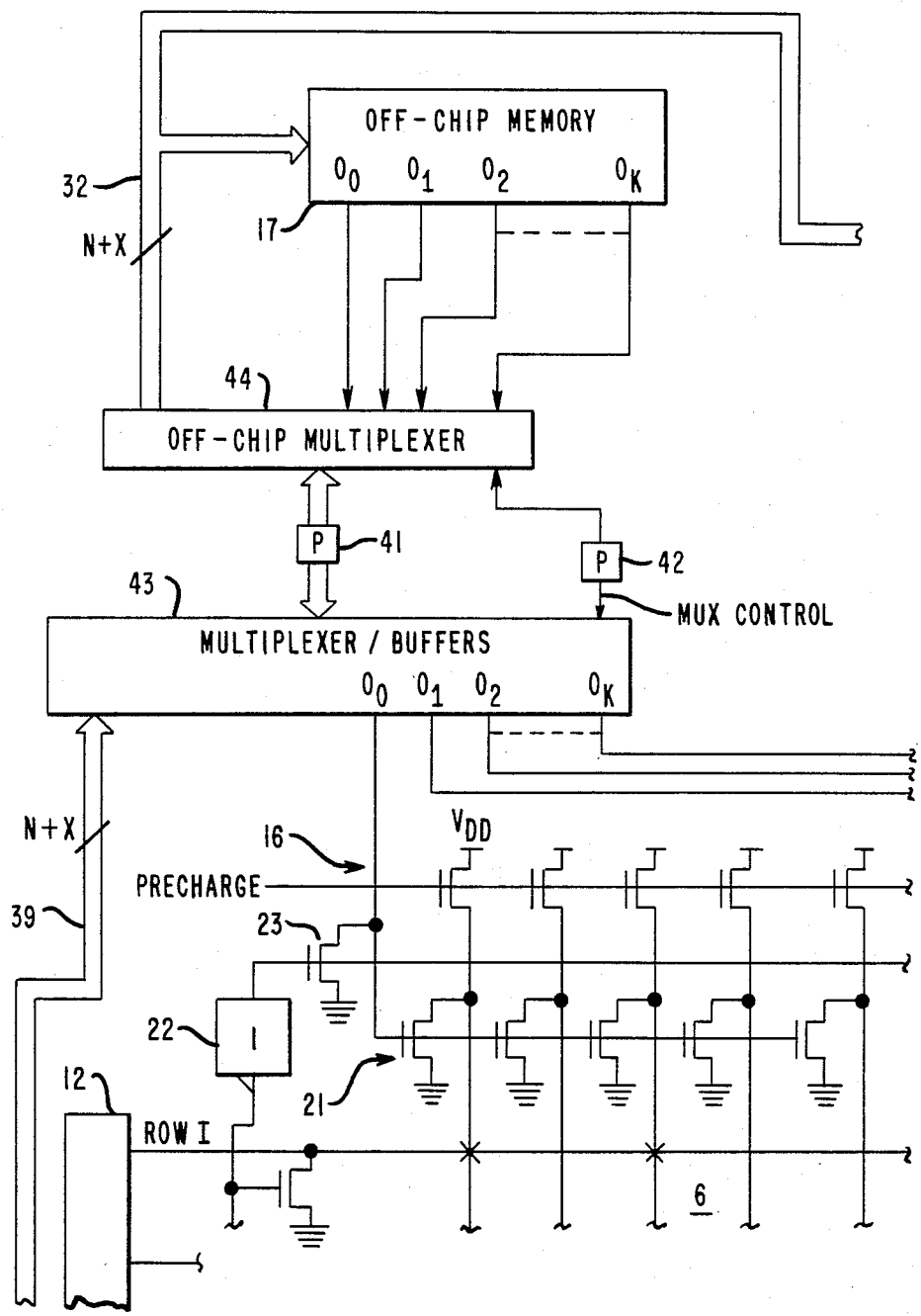
FIG. 4 schematically depicts a multiplexed version of the TRANSBUS architecture in FIG. 3.

A second embodiment of the present invention is schematically presented in FIG. 4 of the drawings. For purposes of overall structure and operation, the circuit in FIG. 4 corresponds to the upper section of the circuit in FIG. 3A. The fundamental distinction between the embodiment represented by FIGS. 3A and the alternate embodiment shown in FIG. 4 resides in the multiplexing of the externally directed Address Word Bus, 39, with Instruction Word lines $O_0$–$O_K$ to reduce the number of bonding pads. Momentarily reflecting back to FIG. 3A, one can readily determine that the total number of bonding pads required for that embodiment is equal to the numerical sum of $(N+X)+(K+1)$. The embodiment in FIG. 4, however, reduces the number of bonding pads to the greater of either $(N+X+1)$ or $(K+2)$. This total count includes the group of bonding pads at 41, for the multiplexed signal lines, and an additional bonding pad, 42, for coupling the multiplexing control signal (MUX) between the On-Chip Multiplexer/Buffer 43 and Off-Chip Multiplexer 44.

One skilled in the art will no doubt recognize that the grouping of ROM Array 6 into sections of column lines can be rearranged with relative ease into sections of row lines or other compatible arrangements to practice the teachings of the present invention. Consequently, it should be understood that the exemplary embodiments are merely two of numerous possible arrangements by which persons of ordinary skill in the art can practice the present invention as it is set forth in the following claims.

I claim:

1. A memory system, comprising:
   a matrix memory array having a set of row lines and a set of column lines;
   a source of instruction word signals;
   a source of address word signals;
   a row select coupled between the said source of address word signals and the row lines;
   a column select coupled between the said source of address word signals and the column lines; and
   means for disabling the row select in time coincidence with the transmission of instruction word signals from said source of instruction word signals to the column lines.

2. The system recited in claim 1, further including means for disabling the transmission of instruction word signals from the column lines operable in time coincidence with the enabling of said row select.

3. The system recited in claim 2, wherein said source of instruction word signals is comprised of a separate addressable memory array.

4. The system recited in claim 3, further including:
   means for transmitting address word signals to said separate addressable memory array; and
   means for decoding the address word signals to synchronize the operation of said means for disabling the row select with the operation of said means for disabling the tranmission of instruction word signals.

5. The system recited in claim 4, wherein the column lines are grouped into sections, and at least one section has both a column select and an instruction word bit output line.

6. The system recited in claim 5, wherein the instruction word signals are coupled into sections having corresponding instruction word bits.

7. The system recited in claim 5, wherein:
   said means for disabling the row select is comprised of field effect transistors for grounding the row lines.

8. The system recited in claim 7, wherein:

the instruction word signals and address word signals are multiplexed into a common bus joining said matrix memory array with said separate addressable memory array; and said matrix memory array and said separate addressable memory array are integrated circuit ROMs.

9. The system recited in claim 8, wherein said matrix array and said separate addressable memory array are located on separate integrated circuit chips.

* * * * *